United States Patent
Kreupl et al.

(10) Patent No.: US 7,863,700 B2
(45) Date of Patent: Jan. 4, 2011

(54) MAGNETORESISTIVE SENSOR WITH TUNNEL BARRIER AND METHOD

(75) Inventors: Franz Kreupl, Munich (DE); Ulrich Klostermann, Munich (DE)

(73) Assignee: Qimonda AG, Munich (DE)

( * ) Notice: Subject to any disclaimer, the term of this patent is extended or adjusted under 35 U.S.C. 154(b) by 254 days.

(21) Appl. No.: 12/164,765

(22) Filed: Jun. 30, 2008

(65) Prior Publication Data

US 2009/0322319 A1    Dec. 31, 2009

(51) Int. Cl.
    *H01L 29/82* (2006.01)
(52) U.S. Cl. ................................ 257/421; 438/3
(58) Field of Classification Search .......... 438/3; 257/421
    See application file for complete search history.

(56) References Cited

U.S. PATENT DOCUMENTS

| | | | |
|---|---|---|---|
| 6,515,897 B1 * | 2/2003 | Monsma et al. ............. 365/173 |
| 6,628,542 B2 | 9/2003 | Hayashi et al. |
| 6,756,128 B2 | 6/2004 | Carey et al. |
| 6,791,806 B1 | 9/2004 | Gao et al. |
| 7,234,360 B2 | 6/2007 | Quandt et al. |
| 2005/0173771 A1 | 8/2005 | Sharma |
| 2005/0207071 A1 * | 9/2005 | Sato et al. ................ 360/324.2 |
| 2005/0225905 A1 | 10/2005 | Tera et al. |
| 2006/0202692 A1 | 9/2006 | Tatschl et al. |
| 2007/0109838 A1 * | 5/2007 | Zheng et al. ................ 365/158 |
| 2010/0102407 A1 * | 4/2010 | Kajiyama et al. ........... 257/421 |
| 2010/0109109 A1 * | 5/2010 | Chen et al. ................. 257/421 |

FOREIGN PATENT DOCUMENTS

EP    1052520 A1    11/2000

OTHER PUBLICATIONS

"A Perpendicular Spin Torque Switching based MRAM for the 28 nm Technology Node", U.K. Klostermann, et al., IEDM 2007.
"Adapting GMR sensors for integrated devices", K. Ludwig, et al., Sensors and Actuators A 106 (2003) 15-18.
"Angular Sensor Using Tunneling Magnetoresistive Junctions With an Artificial Antigerromagnet Reference Electrode and Improved Thermal Stability", Manfred Ruhrig, et al., IEEE Transactions on Magnetics, vol. 40, No. 1, Jan. 2004.
"Spin dependent tunneling junctions with reduced Neel coupling", Dexin Wang, et al., Journal of Applied Physics, vol. 93, No. 10, May 15, 2003.
"Thermal Select MRAM with a 2-bit Cell Capability for beyond 65 nm Technology Node", R. Leuschner, et al., IEDM 2006.

* cited by examiner

*Primary Examiner*—Thao P. Le
(74) *Attorney, Agent, or Firm*—Dicke, Billig & Czaja, PLLC

(57) ABSTRACT

Magnetoresistive sensors with tunnel barrier and method. One embodiment provides a magnetoresistive sensor having a magnetic tunnel junction is provided. The magnetic tunnel junction includes a barrier layer. The barrier layer includes carbon, pyrolytic carbon, or graphene, or graphite.

22 Claims, 3 Drawing Sheets

MAGNETORESISTIVE SENSOR WITH TUNNEL BARRIER AND METHOD

TECHNICAL FIELD

Embodiments of the invention relate generally to magnetoresistive sensors including magnetic tunnel junction devices and to a method for manufacturing magnetoresistive sensor.

BACKGROUND OF THE INVENTION

Magnetoresistive devices or magnetoresistive sensor elements are employed in numerous applications as field sensors and movement detectors (e.g., global positioning systems and navigation systems, magnetometry, compassing, angular and linear position sensors, dead reckoning technologies, vehicle or object detection, telematics or movement direction, rotation direction, rotation speed, velocity of a given object with reference to the sensor arrangement) as well as read sensors in magnetic data storage systems to detect magnetically encoded information stored on a magnetic data storage medium or recording heads to record magnetically encoded information on said storage medium.

In particular, tunneling magnetoresistive (TMR) sensors are employed for the above mentioned applications.

A typical tunneling magnetoresistive (TMR) sensor includes a magnetic tunnel junction (MTJ) including two ferromagnetic layers separated by a tunnel barrier layer. The ferromagnetic layers are commonly referred to as a "fixed" or "reference" layer, in which the direction of magnetization is fixed, and a "free" layer or "sense" layer, in which the direction of magnetization may be switched.

The resistance of an MTJ varies based on the relative directions of magnetization of these layers. For example, when the directions of magnetization of the fixed and free layers are parallel, the resistance may be relatively small, and may become greater when the directions of magnetization are anti-parallel.

For tunneling magnetoresistive (TMR) sensors configured to operate in a current-perpendicular-to-plain mode (CPP) a sense current flowing perpendicular to the plane of the layers of the magnetic tunnel junction (MTJ) experiences a change in resistance which is proportional to the magnetic orientation of a free layer relative to the reference layer.

The resistance change $\Delta R = R_{AP} - R_P$, that is the difference between the anti-parallel ($R_{AP}$) and parallel ($R_P$ or R) resistance values, divided by the parallel resistance $R_P$ is known as the magnetoresistance (MR) ratio of the magnetic tunnel junction (MTJ) and is defined as $(R_{AP} - R_P)/R_P = \Delta R/R_P = \Delta R/R$.

For tunneling magnetoresistive (TMR) sensor applications it is important to have high signal-to-noise ratio (SNR), the magnitude of the SNR being directly proportional to the magnetoresistance ratio (MR ratio=$\Delta R/R$) of the magnetic tunnel junction (MTJ). The signal-to-noise ratio is given by $i_B \Delta R$, $i_B$ being the bias current passing through the MTJ device. However, the noise obtained by the MTJ device is determined, in large part, by the resistance R of the device. Thus, the maximum SNR for constant power used to sense the device can be obtained if the magnetoresistance (MR) ratio is large.

The resistance R of an MTJ device is largely determined by the resistance of the insulating tunnel barrier layer. Moreover, since the currents pass perpendicularly through the ferromagnetic layers and the tunnel layer, the resistance R of an MTJ device increases inversely with the area A of the device, therefore it is convenient to characterize the resistance of the MTJ device by the product of the resistance R times the area A (RA).

In order to allow the resolution of the continuously increasing bit density of the storage medium, magnetoresistive sensors will need to be shrunk in size, requiring low RA values so that the resistance R of the cell is not too high and sufficiently high sense current densities can be used at acceptable values of reliability of the MTJ device.

Conventionally, the materials used for the insulating tunnel barrier layers are (Magnesium Oxide) MgO or Aluminium Oxide ($Al_2O_3$). For MgO or $Al_2O_3$ insulating tunnel barriers it has been found that RA increases exponentially with the thickness of the layer. The thickness of the MgO or $Al_2O_3$ insulating tunnel barrier layers can be varied over a sufficient range to vary RA by more than eight orders of magnitude, i.e. from more than $2 \times 10^9 \Omega(\mu m)^2$ to as little as $1\Omega(\mu m)^2$. For typical MgO based insulating tunnel barriers a RA product of $1\Omega(\mu m)^2$ to $10\Omega(\mu m)^2$ is required to withstand current densities in the order of $0.1 \text{ MA/(cm)}^2$ to $10 \text{ MA/(cm)}^2$. However, for these low RA values, the magnetoresistance (MR) ratio, and therefore the SNR, is typically reduced, in part because of microscopic pin holes or other defects in the ultra thin tunnel barrier layers needed to obtain these very low RA values. Moreover, the ultra thin tunnel barrier layers needed to obtain these very low RA values reduces the barrier reliability.

A widely observed effect in tunneling magnetoresistive (TMR) sensor is the so-called "Neel coupling", which is a coupling between the sense layer and the reference layer due to magnetostatic interactions between the free poles at the two ferromagnetic interfaces. This coupling is associated with the roughness of the conventional thin insulating barrier and causes a shift in the preferred parallel alignment of the two ferromagnetic layers and thus a deviation from the theoretically expected behavior of the tunneling magnetoresistive (TMR) sensor.

Therefore there is a need in the art for tunneling magnetoresistive (TMR) sensors characterized by a large and stable tunneling magnetoresistance (MR) ratio, a reliable tunnel barrier layer, a low RA value and a reduced Neel effect.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DESCRIPTION

In the following Detailed Description, reference is made to the accompanying drawings, which form a part hereof, and in which is shown by way of illustration specific embodiments in which the invention may be practiced. In this regard, directional terminology, such as "top," "upper", "lower," "central", "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
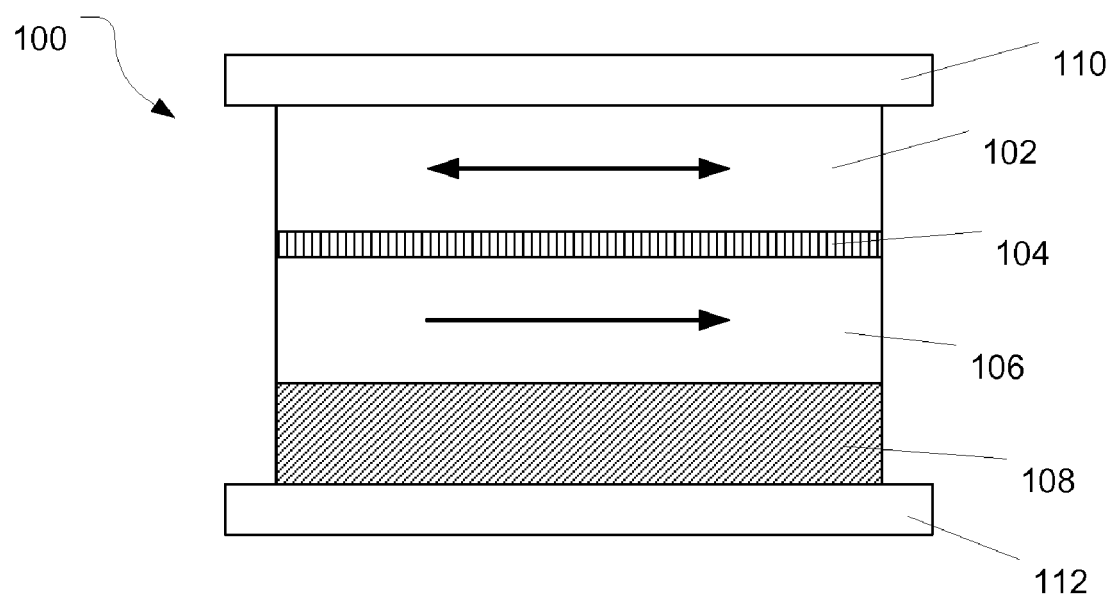
FIG. 1 illustrates the structure of a MTJ for use as a tunneling magnetoresistive (TMR) sensor according to one embodiment.

FIG. 1 illustrates the structure of a MTJ for use as a tunneling magnetoresistive (TMR) sensor according to one embodiment. The MTJ 100 includes a free layer (also referred to as "second ferromagnetic layer") 102, a barrier layer 104, a fixed layer (also referred to as "first ferromagnetic layer") 106 and an antiferromagnetic layer (also referred to as "first antiferromagnetic layer") 108. The fixed layer 106 and free layer 102 are typically ferromagnetic, with the fixed layer 106 having a fixed orientation of magnetization, and the free layer 102 having an orientation of magnetization that can be rotated in response to the spin polarization of a current that is driven through the MTJ 100. In an embodiment of the invention, the antiferromagnetic layer 108 is used to fix (or "pin") the orientation of magnetization of the fixed layer 106. The tunnel barrier layer 104 is configured to permit tunneling of electrons through the barrier layer 104 in the MTJ 100. Also illustrated are a top contact 110 and a bottom contact 112, which are used to drive current through the MTJ 100.

The resistance of the MTJ 100 varies according to the relative orientations of magnetization of the fixed layer 106 and the free layer 102. When the orientation of magnetization of the free layer 102 is parallel to the orientation of magnetization of the fixed layer 106, then the resistance of the MTJ 100 is low. The resistance of the MTJ 100 becomes higher when the orientation of magnetization of the free layer 102 is antiparallel to the orientation of magnetization of the fixed layer 106.

These layers may be composed of a variety of materials. Generally, the free layer 102 and the fixed layer 106 contain ferromagnetic metals, such as Fe, Co, Ni, Tb, Cu, Pt, or various alloys of such metals. In one embodiment, other ferromagnetic materials, such as the Heusler alloys NiMnSb, PtMnSb, $Co_2MnSi$, or oxides such as $Fe_3O_4$ or $CrO_2$ may be used. In one embodiment, the free layer 102 and the fixed layer 106 may include multilayer sheets, e.g., including a multilayer structure $[Ni/Co/Ni/Co]_n$ or $[Co/Pt/Co/Pt]_n$, wherein n is an index indicating the number of a respective multilayer structure. In one embodiment, the free layer 102 and the fixed layer 106 may include CoTbFe alloys. The fixed layer 106 may be replaced by an artificial antiferromagnet (AAF), including alternating ferromagnetic and non-magnetic layers having an exchange coupling such that in the absence of an external magnetic field, the magnetization directions of the ferromagnetic layers are antiparallel. The barrier layer 104 may include a carbon layer, in one embodiment a pyrolytic carbon layer, or in one embodiment a graphene layer, or in one embodiment graphite layer.

Figure 2:
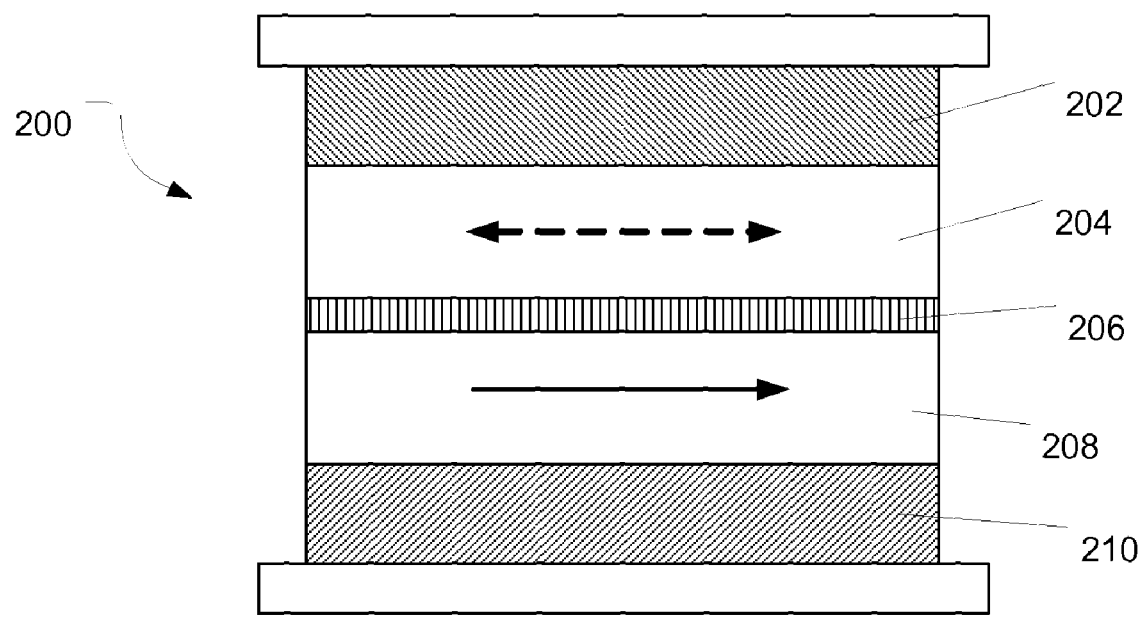
FIG. 2 illustrates an MTJ 200 for use as a tunneling magnetoresistive (TMR) sensor according to another embodiment.

FIG. 2 illustrates an MTJ 200 for use as a tunneling magnetoresistive (TMR) sensor according to another embodiment, which includes an antiferromagnetic pinning layer 202 as an embodiment of a retention layer adjacent to a free layer (also referred to as "second ferromagnetic layer") 204. The free layer 204 is separated from a fixed layer (also referred to as "first ferromagnetic layer") 208 by a barrier layer 206. The magnetization of the fixed layer 208 is pinned by an antiferromagnetic layer (also referred to as "first antiferromagnetic layer") 210. These layers may be composed of a variety of materials. Generally, the free layer 204 and the fixed layer 208 may contain ferromagnetic metals, such as Fe, Co, Ni, Tb, Cu, Pt, or various alloys of such metals. In one embodiment, other ferromagnetic materials, such as the Heusler alloys NiMnSb, PtMnSb, Co2MnSi, or oxides such as Fe3O4 or CrO2 may be used. In an embodiment of the invention, the free layer 204 and the fixed layer 208 may include multilayer sheets, e.g., including a multilayer structure [Ni/Co/Ni/Co]n or [Co/Pt/Co/Pt]n, wherein n is an index indicating the number of a respective multilayer structure. In another embodiment of the invention, the free layer 204 and the fixed layer 208 may include CoTbFe alloys. In some embodiments, the fixed layer 208 may be replaced by an artificial antiferromagnet (AAF), including alternating ferromagnetic and non-magnetic layers having an exchange coupling such that in the absence of an external magnetic field, the magnetization directions of the ferromagnetic layers are antiparallel. The barrier layer 206 may include a carbon layer, in one embodiment a pyrolytic carbon layer, or in one embodiment a graphene layer, or in one embodiment graphite layer. The antiferromagnetic pinning layer 202 and antiferromagnetic layer 210 may be natural antiferromagnets, including materials such as FeMn, NiMn, PtMn, IrMn, $RhMn_3$, $Ir_{20}Mn_{80}$, $Pd_{52}Pt_{18}Mn_{50}$, NiO, $\alpha\text{-}Fe_2O_3$, or $a\text{-}Tb_{25}Co_{75}$. In one embodiment, one or both of the antiferromagnetic pinning layer 202 and antiferromagnetic layer 210 may include an artificial antiferromagnet, composed, for example, of alternating layers of ferromagnetic and non-magnetic materials. The antiferromagnetic pinning layer 202 has a relatively low blocking temperature, and serves to pin the orientation of magnetization of the free layer 204, providing additional magnetization stability at room temperature.

When current is applied through the MTJ 200, the current will cause heating of the MTJ 200, due to the resistance of the barrier layer. This heating may be sufficient to reach the blocking temperature of the antiferromagnetic pinning layer 202. For a natural antiferromagnet, for example, the blocking temperature will depend on the material chosen for the antiferromagnetic pinning layer 202 and the thickness of the layer. Thus, for a natural antiferromagnetic material used in the antiferromagnetic pinning layer 202, the blocking temperature can be tailored to a convenient value by adjusting the thickness of the material. For instance, if IrMn is used for the antiferromagnetic pinning layer 202, a thickness of 3 nm will provide a blocking temperature of 160° C., which is sufficiently high to ensure that the cells are pinned at room temperature or operating temperature. Because the fixed layer 208 should continue to be pinned by the antiferromagnetic layer 210, the blocking temperature of the antiferromagnetic layer 210 should be set higher than the temperature that will be reached through application of current. This can be achieved, for example, through the use of a natural antiferromagnetic material having a higher blocking temperature, such as PtMn, and by selecting an appropriate thickness such as, e.g., a layer thickness of about 20 nm.

Figure 3:
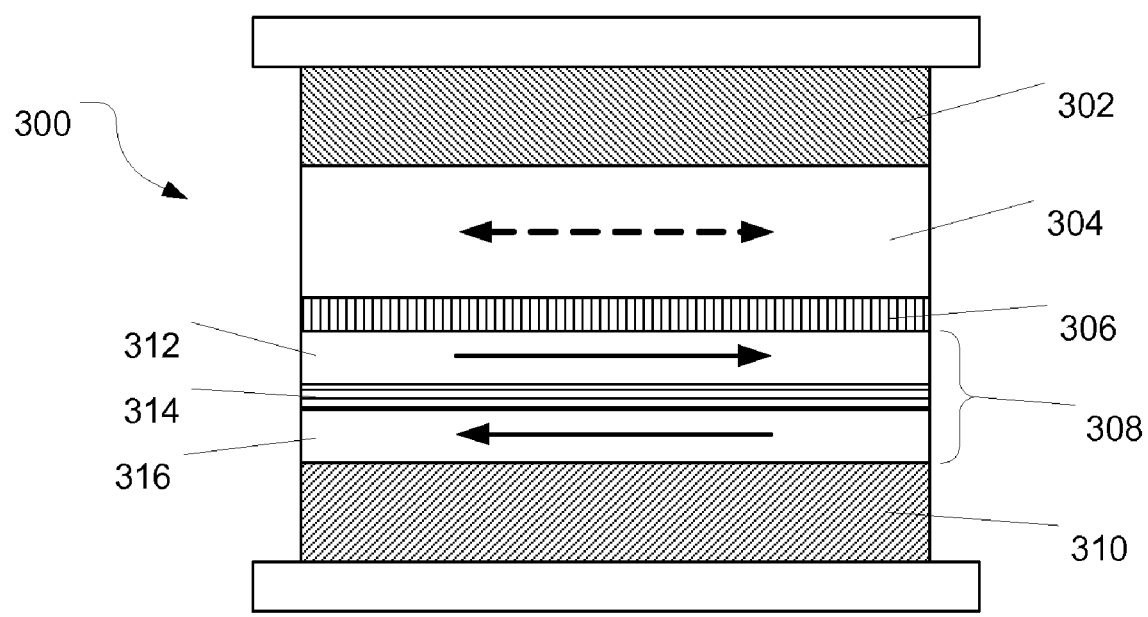
FIG. 3 illustrates one alternative embodiment of an MTJ for use as a tunneling magnetoresistive (TMR) sensor.

FIG. 3 illustrates one alternative embodiment of an MTJ for use as a tunneling magnetoresistive (TMR) sensor. As illustrated in FIG. 3, an MTJ 300 includes an antiferromagnetic pinning layer 302, which has a relatively low blocking temperature, suitable for pinning the magnetization orientation of a free layer (also referred to as "second ferromagnetic layer") 304 at room temperature. The free layer 304 is separated from an artificial antiferromagnetic layer 308 by a barrier layer 306. The barrier layer 306 may include a carbon layer, in one embodiment a pyrolytic carbon layer, or in one embodiment a graphene layer, or in one embodiment graphite layer. The artificial antiferromagnetic layer 308 (also referred to as synthetic antiferromagnetic layer") serves a similar purpose to a fixed layer, and is pinned by a antiferromagnetic layer (also referred to as "first antiferromagnetic layer") 310, having a relatively high blocking temperature.

The artificial antiferromagnetic layer 308 includes a fourth ferromagnetic layer 312 with a magnetization orientation that is antiparallel to a third ferromagnetic layer 316. The fourth ferromagnetic layer 312 is separated from the third ferromagnetic layer 316 by a non-magnetic layer 314, with a thickness selected to facilitate antiferromagnetic interlayer exchange between the fourth ferromagnetic layer 312 and the third ferromagnetic layer 316. In one embodiment, other designs for the artificial antiferromagnetic layer 308, including multiple ferromagnetic and non-magnetic layers may be used.

As in the embodiment described with reference to FIG. 2, the thickness and material of the antiferromagnetic pinning layer 302 may be selected to provide a blocking temperature that permits the antiferromagnetic pinning layer 302 to pin the free layer 304 at room temperature or operating temperature, but to have little or substantially no effect on the free layer 304 at a temperature that will be reached during writing of the MTJ 300.

In all embodiments described in FIGS. 1-3 an MTJ includes a barrier layer which may include a carbon layer, in one embodiment a pyrolytic carbon layer, or in one embodiment a graphene layer, or in one embodiment graphite layer. Using this particular material for the barrier layer makes possible to obtain very small RA values without necessarily reducing the thickness of the barrier layer. For conventional MgO or Al2O3 insulating tunnel barriers it has been found that RA increases exponentially with the thickness of the layer. For typical conventional MgO based MRAM insulating tunnel barriers an RA of 1Ω(µm)2 to 10Ω(µm)2 are typical. However, in conventional MgO or Al2O3 insulating tunnel barriers, for these low RA values the magnetoresistance (MR) ratio, and therefore the SNR, is typically reduced, in part because of microscopic pin holes or other defects in the ultra thin tunnel barrier layers needed to obtain these very low RA values. Moreover, the ultra thin tunnel barrier layers needed to obtain these very low RA values leads to increased Neel coupling and therefore to a deviation from the ideal behaviour of the sensor. On the contrary an MTJ including a carbon barrier layer, and in one embodiment a pyrolytic carbon layer, or in one embodiment a graphene layer, or in one embodiment graphite layer according to one embodiment of the invention, can have very small RA values (e.g., approximately 0.1Ω (µm)2) without reducing the thickness of the barrier layer (e.g., approximately 5 nm thickness) and therefore, will experience very small Neel coupling due to the fact that the barrier layer can be made as thick as 5 nm without compromising RA. As a consequence, carbon barrier layers according to one embodiment of the invention can be more easily fabricated and provide a reduction of the magnetic interaction between the free layer and the reference layer when compared with conventional MgO or Al2O3 insulating tunnel barriers. Moreover, the use of a carbon barrier layer, and in one embodiment a pyrolytic carbon layer, or in one embodiment a graphene layer, or in one embodiment graphite layer in magnetic tunnel junctions, according to one embodiment of the invention, results in significant improvement in the MR ratio (due to the almost total absence of spin scattering MR ratio of more than 75% can be achieved), significant improvement of the interface properties with the free layer and the fixed layer (due to the excellent interface properties of carbon and Ni magnetic systems or Graphene and Co magnetic systems), significant improvement of the thermal stability (due to the thermal stability of carbon), significant improvement in the deposition process which becomes very conformal and homogeneous, significant improvement in the etch and patterning processes due to the high etch selectivity against metals, significant reduction of swelling and damage processes due to the high corrosion resistance of the graphene. The long term stability performance of the carbon barrier may lead to less resistance drift over lifetime and can be a key-enabler for rugged environments and can reduce compensation overhead for the electronics.

Moreover, the use of a carbon barrier layer, and in one embodiment a pyrolytic carbon layer, or in one embodiment a graphene layer, or in one embodiment graphite layer in magnetic tunnel junctions, according to one embodiment of the invention, results in significant reduction of the "Neel coupling" and therefore allows to use softer free layer materials which in turn leads to an increased sensitivity of the sensor.

Such magnetoresistive sensors may be employed in numerous applications as field sensors and movement detectors (e.g., global positioning systems and navigation systems, magnetometry, compassing, angular and linear position sensors, dead reckoning technologies, vehicle or object detection, telematics or movement direction, rotation direction, rotation speed, velocity of a given object with reference to the sensor arrangement) as well as read sensors in magnetic data storage systems to detect magnetically encoded information stored on a magnetic data storage medium or recording heads to record magnetically encoded information on said storage medium.

In summary, in one embodiment a magnetoresistive sensor is provided, having a magnetic tunnel junction that includes a barrier layer, the barrier layer including carbon, in one embodiment pyrolytic carbon, or in one embodiment graphene, or graphite. In some embodiments the barrier layer is disposed between a first ferromagnetic layer and a second ferromagnetic layer, and the barrier layer is disposed proximate to the first ferromagnetic layer. While the first ferromagnetic layer may have a fixed magnetization orientation, the second ferromagnetic layer has a magnetization orientation that may be selected by the application of a sense current through the magnetic tunnel junction. In some embodiments the magnetic tunnel junction may include a first antiferromagnetic layer disposed proximate to the first ferromagnetic layer, which may be configured to pin the orientation of the first ferromagnetic layer. The magnetic tunnel junction may also include a second antiferromagnetic layer disposed proximate to the second ferromagnetic layer, which may be configured to pin the orientation of the second ferromagnetic layer. In some embodiments the first ferromagnetic layer may include a third ferromagnetic layer disposed proximate to the first antiferromagnetic layer, this non-magnetic layer being disposed on or above the third ferromagnetic layer and a fourth ferromagnetic layer disposed proximate to the non-magnetic layer. In some embodiments of the invention the magnetoresistive sensor may be a read head configured to be used in magnetic data storage systems to detect magnetically encoded information stored on a magnetic data storage medium. In some other embodiments the magnetoresistive sensor may be configured to be used in a global positioning system. In some alternative embodiments the magnetoresistive sensor of may be a field sensor configured to act as a position sensor for linear or angular positions.

In another embodiment, a method is provided for manufacturing a magnetoresistive sensor having a magnetic tunnel junction, the method including forming a barrier layer, the barrier layer including carbon, in one embodiment pyrolytic carbon, or in one embodiment graphene, or graphite. In some embodiments the barrier layer is formed proximate to the first ferromagnetic layer and a second ferromagnetic layer is formed proximate to the barrier layer. In some embodiments the first ferromagnetic layer is formed proximate to a first antiferromagnetic layer and a second antiferromagnetic layer proximate to the second ferromagnetic layer. In some other embodiments forming the first ferromagnetic layer includes forming a third ferromagnetic layer disposed proximate to the first antiferromagnetic layer, forming a non-magnetic layer proximate to the third ferromagnetic layer, and forming a fourth ferromagnetic layer proximate to the non-magnetic layer.

Different methods are possible for the deposition of the barrier layer, wherein the barrier layer includes carbon, in one embodiment pyrolytic carbon, or in one embodiment graphene, or graphite.

Chemical vapor deposition (CVD) by pyrolysis of a carbon containing gas is one of these methods. Acetylene may be used at temperatures between 300°-850° C., although a typical temperature range may be 400°-500° C. At lower temperatures, a short photon flux produced by a laser or a flash lamp can be used to induce the deposition of the graphite (or pyrolytic carbon, or in one embodiment graphene).

Another possible method for for the deposition of the barrier layer, wherein the barrier layer includes carbon, in one embodiment pyrolytic carbon, or in one embodiment graphene, or graphite is the combination of sputter deposition and annealing: a thin carbon layer (i.e. 1-5 nm thick) may be deposited on the magnetic stack. After deposition the carbon may be annealed at 400°-500° C. or at higher temperatures with a flash lamp or laser pulse.

Another possible method for for the deposition of the barrier layer, wherein the barrier layer includes carbon, in one embodiment pyrolytic carbon, or in one embodiment graphene, or graphite is Laser Chemical vapor deposition CVD: a laser beam may be scanned over the wafer which may be immersed in a carbon containing gas. At the location of the laser beam on the wafer surface, carbon can deposit.

Another possible method for the deposition of the barrier layer, wherein the barrier layer includes carbon, in one embodiment pyrolytic carbon, or in one embodiment graphene, or graphite is the combination of spin-on coating of polymers and subsequent annealing: a positive photoresist can be spin-coated on to a wafer spinning at for example 8000 rpm on a spin coater. The spin time may be 30 s and may yield a thickness between 10-20 nm. The spin-coated wafer may be a soft-baked for example at 90° C. for 20 min. Pyrolysis may occur in a furnace with forming gas (e.g., 95% $N_2$+5% $H_2$) for approximately 20 min at room temperature. Gas flow may be continued while the temperature may be increased at the rate of, for example, 10° C./min to 400°-600° C., held at approximately 500° C. for 60 min. A flash anneal by a flash lamp or laser may be used to improve the graphite quality.

Subsequently, after deposition of the barrier layer, the second ferromagnetic layer and the top contact may be sputtered onto the carbon. An optional annealing in magnetic field may be applied to set the fixed magnetic layer properly. The second ferromagnetic layer may be patterned into the desired form. As an option, the extreme selectivity of the wet or dry etch against carbon can be used to stop on the carbon layer. A nitride or oxide (e.g., $Al_2O_3$) layer may be deposited and a spacer etch can be etched. The carbon may then be structured by a dry etch. Subsequently, the structure may be filled with oxide and planarized. Additional conventional processes may be needed to form the final memory chip.

It is important to mention that conventional thin metal oxide barriers have little process margin to provide a selective etch stop for free layer patterning, and this means that in conventional magnetic tunnel junctions a full stack etch with etching through the barrier often results in the redeposition of conductive by-products. On the contrary, magnetic tunnel junctions having a carbon barrier layer (in one embodiment pyrolytic carbon, or in one embodiment graphene, or graphite) according to different embodiments of the invention offer excellent etch selectivity due to better chemical selectivity and to the possibility of using relatively thicker barrier. Therefore spacer patterning techniques can significantly enhance processing yield, as the redeposition path across the barrier can be significantly reduced.

While the invention has been particularly illustrated and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In addition, the magnetization direction of the magnetic structures described in all embodiments of the invention can be in-plane or perpendicular to plane (even if the figures may illustrate only in-plane configurations).

What is claimed is:

1. A device comprising:
   a magnetoresistive sensor comprising a magnetic tunnel junction, the magnetic tunnel junction including a barrier layer, the barrier layer including carbon,
   wherein the magnetic tunnel junction has a magnetoresistance ratio greater than 75%.

2. The device of claim 1, wherein the barrier layer comprises pyrolytic carbon.

3. The device of claim 1, wherein the barrier layer comprises graphene.

4. The device of claim 1, wherein the barrier layer comprises graphite.

5. The device of claim 1, wherein the barrier layer is disposed between a first ferromagnetic layer and a second ferromagnetic layer.

6. The device of claim 5, wherein the first ferromagnetic layer has a fixed magnetization orientation.

7. The device of claim 5, comprising:
   a first antiferromagnetic layer disposed proximate to the first ferromagnetic layer, the first antiferromagnetic layer being configured to pin the orientation of the first ferromagnetic layer.

8. The device of claim 7, comprising:
   a second antiferromagnetic layer disposed proximate to the second ferromagnetic layer, the second antiferromagnetic layer being configured to pin the orientation of the second ferromagnetic layer.

9. The device of claim 8, wherein the first ferromagnetic layer comprises a third ferromagnetic layer disposed proximate to the first antiferromagnetic layer, a non-magnetic layer disposed proximate to the third ferromagnetic layer and a fourth ferromagnetic layer disposed proximate to the non-magnetic layer.

10. The device of claim 1, wherein the magnetoresistive sensor is a read head configured to be used in magnetic data storage systems to detect magnetically encoded information stored on a magnetic data storage medium.

11. The device of claim 1, wherein the magnetoresistive sensor is configured to be used in a global positioning system.

12. The device of claim 1, wherein the magnetoresistive sensor is a field sensor configured to act as a position sensor for linear or angular positions.

13. A method of manufacturing a magnetoresistive sensor comprising:
   forming a magnetic tunnel junction having a magnetoresistance ratio greater than 75%;
   forming a barrier layer, the barrier layer including carbon; and
   forming an additional layer.

14. The method of claim 13, wherein the barrier layer includes pyrolytic carbon.

15. The method of claim 13, wherein the barrier layer includes graphene.

16. The method of claim 13, wherein the barrier layer includes graphite.

17. The method of claim 13, comprising:
   forming a first ferromagnetic layer, wherein the barrier layer is formed proximate to the first ferromagnetic layer.

18. The method of claim 17, wherein forming the first ferromagnetic layer comprises:
   forming a third ferromagnetic layer disposed proximate to a first antiferromagnetic layer;
   forming a non-magnetic layer proximate to the third ferromagnetic layer; and
   forming a fourth ferromagnetic layer proximate to the non-magnetic layer.

19. The method of claim 17, comprising:
   forming a second ferromagnetic layer proximate to the barrier layer.

20. The method of claim 19, comprising forming the first ferromagnetic layer proximate to a first antiferromagnetic layer.

21. The method of claim 20, comprising forming a second antiferromagnetic layer proximate to the second ferromagnetic layer.

22. An integrated circuit comprising:
   a magnetoresistive sensor comprising a magnetic tunnel junction including a barrier layer, the barrier layer including carbon; and
   one or more additional layers,
   wherein the magnetic tunnel junction has a magnetoresistance ratio greater than 75%.

* * * * *